United States Patent
Li et al.

(10) Patent No.: US 10,840,147 B1
(45) Date of Patent: Nov. 17, 2020

(54) FIN CUT FORMING SINGLE AND DOUBLE DIFFUSION BREAKS

(71) Applicant: International Business Machines Corporation, Armonk, NY (US)

(72) Inventors: Juntao Li, Cohoes, NY (US); Junli Wang, Slingerlands, NY (US); Kangguo Cheng, Schenectady, NY (US); Ruilong Xie, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/391,346

(22) Filed: Apr. 23, 2019

(51) Int. Cl.
*H01L 21/8234* (2006.01)
*H01L 27/092* (2006.01)
*H01L 21/8238* (2006.01)
*H01L 27/088* (2006.01)

(52) U.S. Cl.
CPC ........... *H01L 21/823481* (2013.01); *H01L 21/823431* (2013.01); *H01L 21/823821* (2013.01); *H01L 21/823878* (2013.01); *H01L 27/0886* (2013.01); *H01L 27/0924* (2013.01)

(58) Field of Classification Search
CPC ..... H01L 21/823481; H01L 21/823431; H01L 21/823878; H01L 21/823821; H01L 27/0886; H01L 27/0924
USPC ........................................................ 257/401
See application file for complete search history.

(56) References Cited

U.S. PATENT DOCUMENTS

| | | | |
|---|---|---|---|
| 8,878,309 B1 | 11/2014 | Hong et al. | |
| 9,362,181 B1 * | 6/2016 | Xie | ................. H01L 21/823878 |
| 9,406,676 B2 | 8/2016 | Yu et al. | |
| 9,412,616 B1 * | 8/2016 | Xie | .................. H01L 21/76224 |
| 9,589,845 B1 | 3/2017 | Jagannathan et al. | |
| 9,653,583 B1 * | 5/2017 | Zhao | ................. H01L 29/66795 |
| 9,831,272 B2 | 11/2017 | Chen et al. | |
| 9,865,704 B2 | 1/2018 | Xie et al. | |
| 9,984,932 B1 | 5/2018 | Zang et al. | |
| 10,103,172 B2 | 10/2018 | Agarwal et al. | |
| 2016/0190130 A1 | 6/2016 | Yu et al. | |
| 2016/0254180 A1 | 9/2016 | Liu et al. | |
| 2017/0287933 A1 | 10/2017 | Chen et al. | |
| 2017/0338229 A1 | 11/2017 | Oh et al. | |
| 2018/0006035 A1 | 1/2018 | Yuan et al. | |
| 2018/0226336 A1 | 8/2018 | Kim et al. | |
| 2019/0355719 A1 * | 11/2019 | Maeda | ................ H01L 27/0886 |

* cited by examiner

*Primary Examiner* — Karen Kusumakar
*Assistant Examiner* — Adam S Bowen
(74) *Attorney, Agent, or Firm* — Cantor Colburn LLP; L. Jeffrey Kelly

(57) ABSTRACT

A technique relates to a semiconductor device. A trench is formed in a space structured to accommodate at least two dummy gates in a cell, the space structured to accommodate the at least two dummy gates aligning to another two gates in another cell, the space further including an area previously occupied by a portion of fins. Dielectric material is formed in the space, such that the dielectric material in the space in the cell aligns to the another two gates in the another cell.

18 Claims, 18 Drawing Sheets

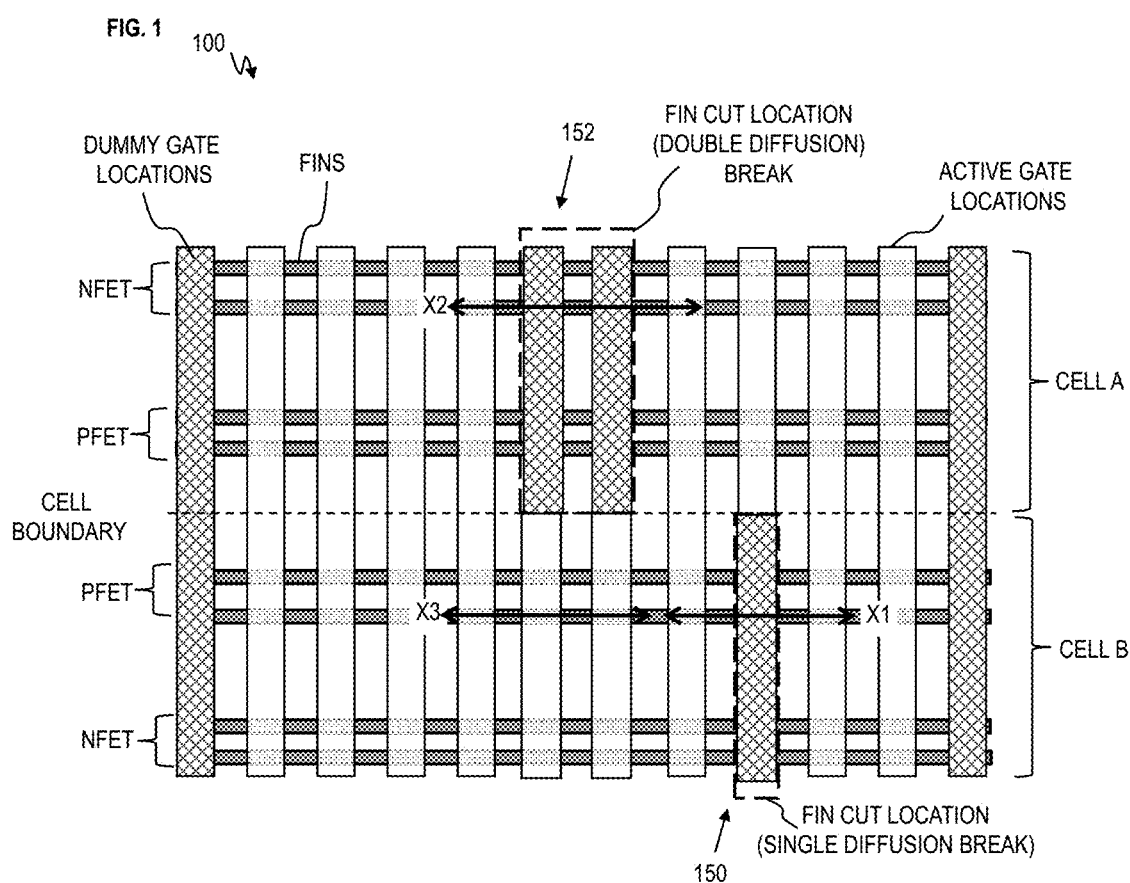

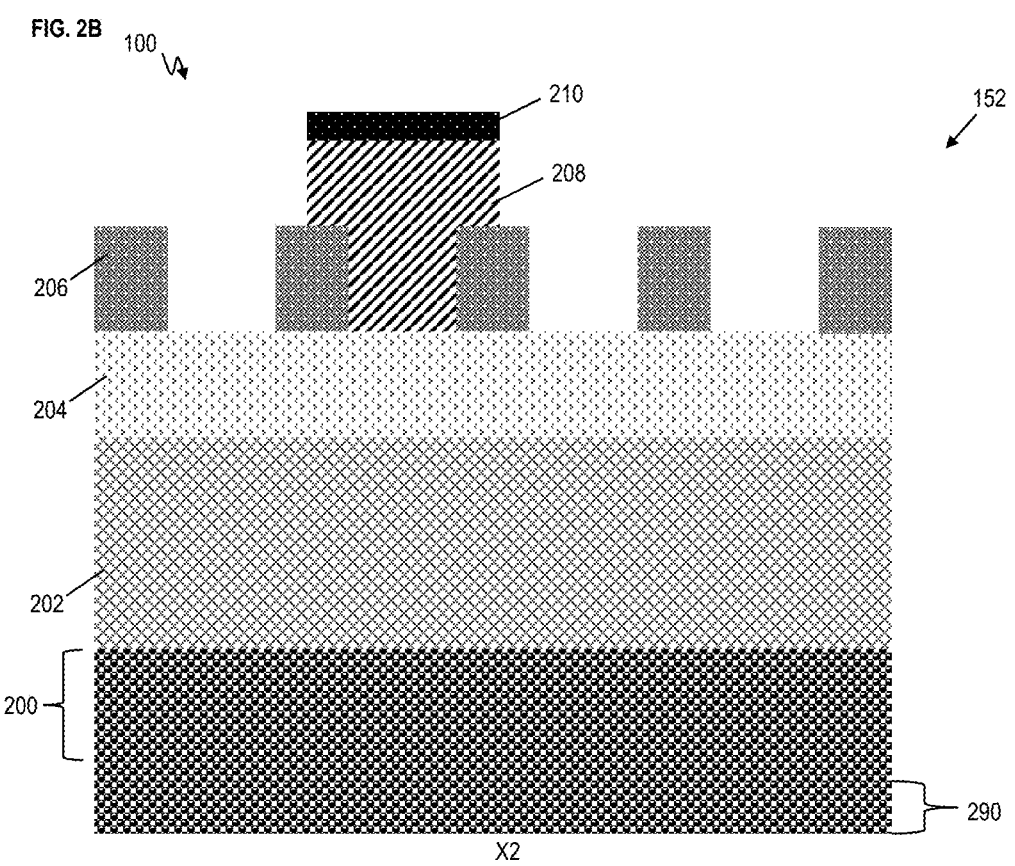

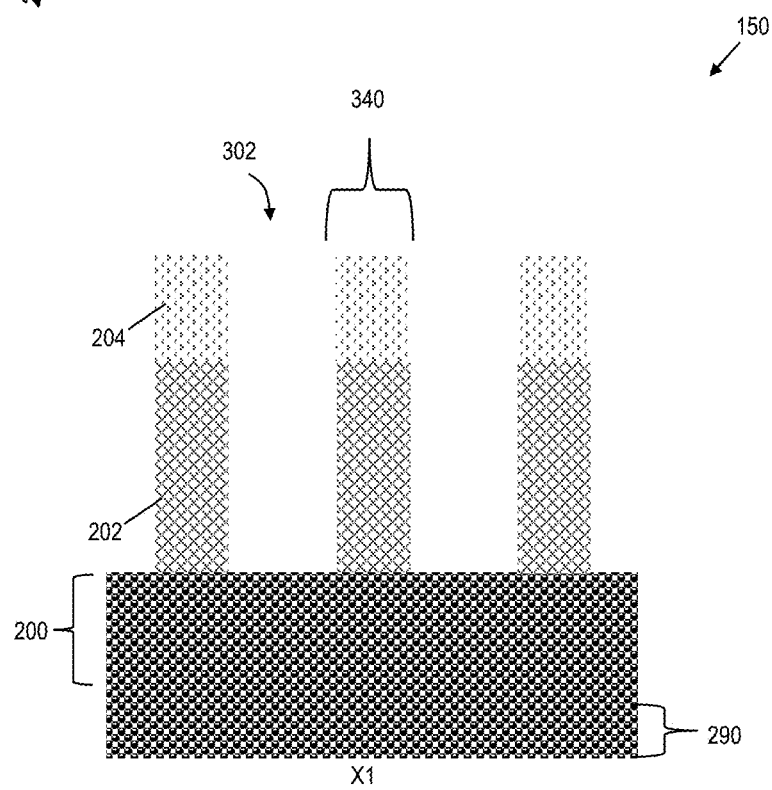

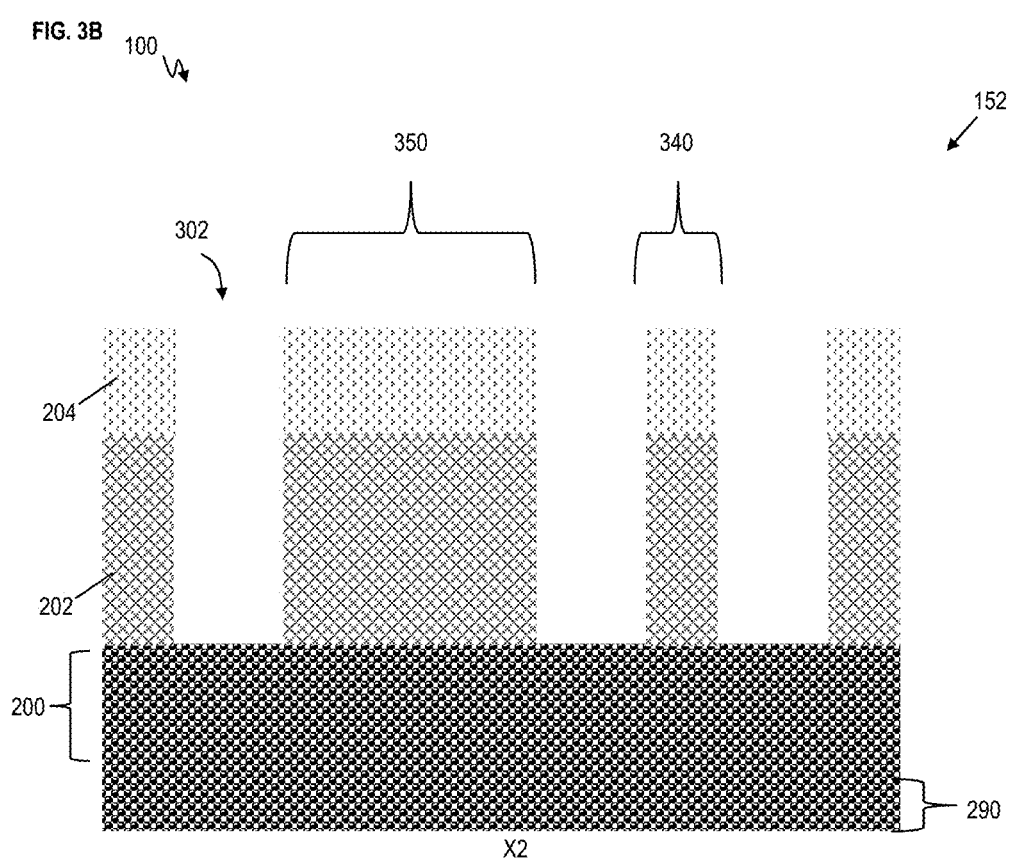

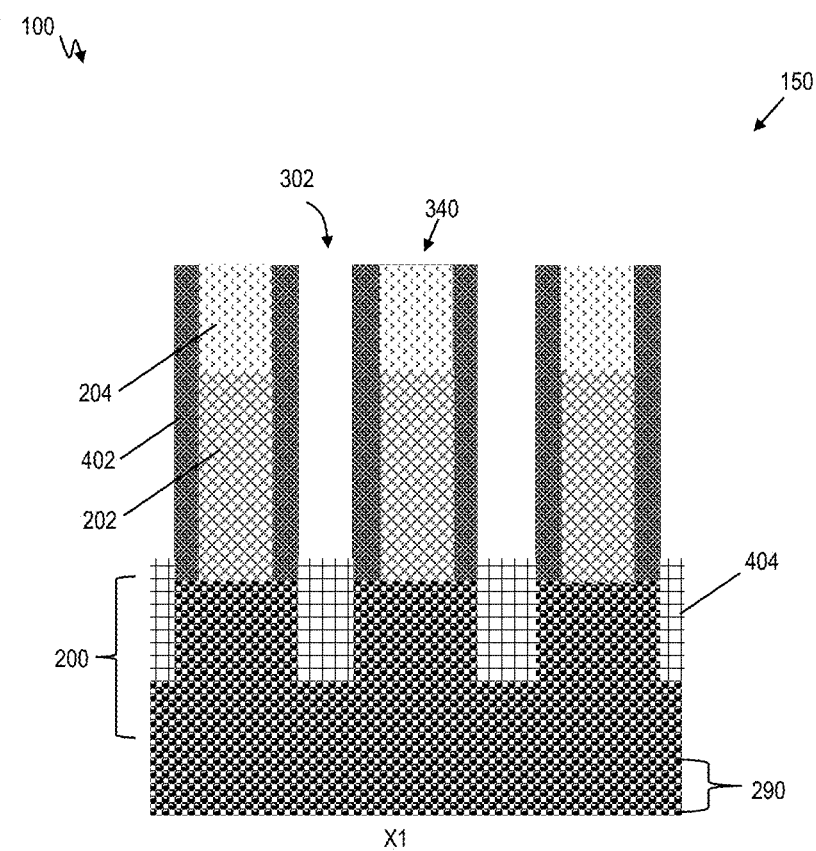

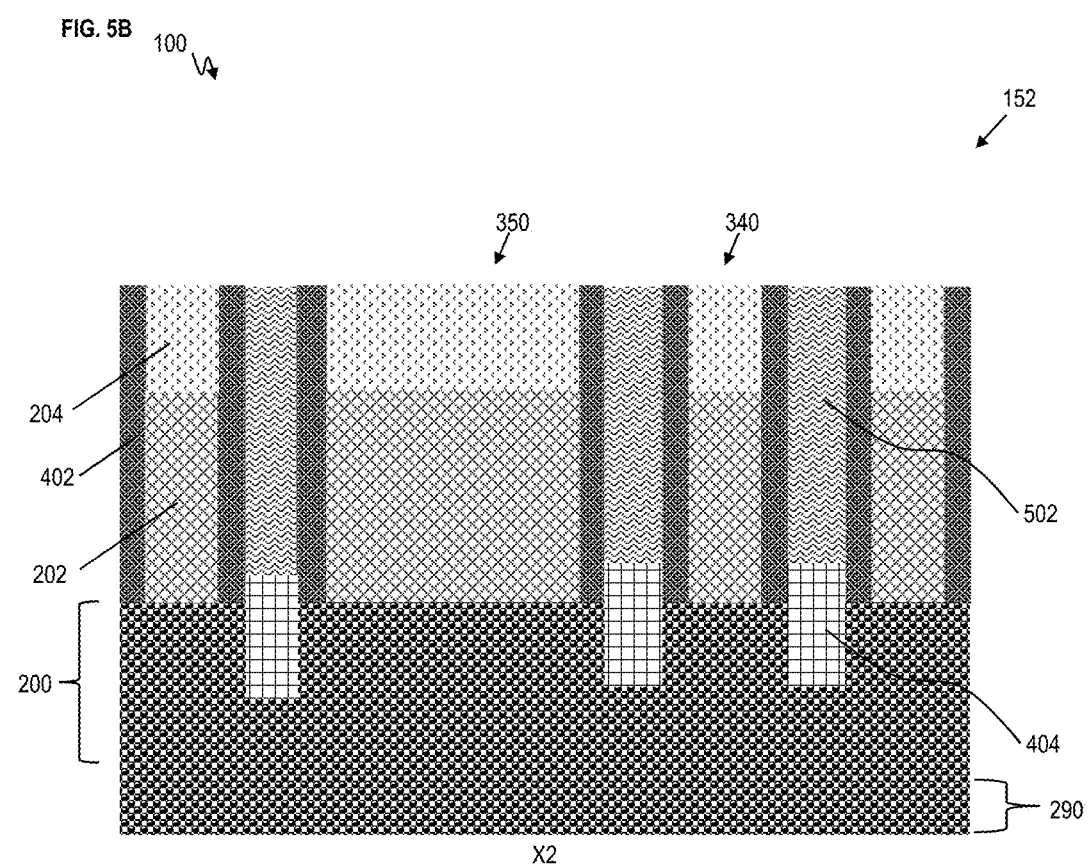

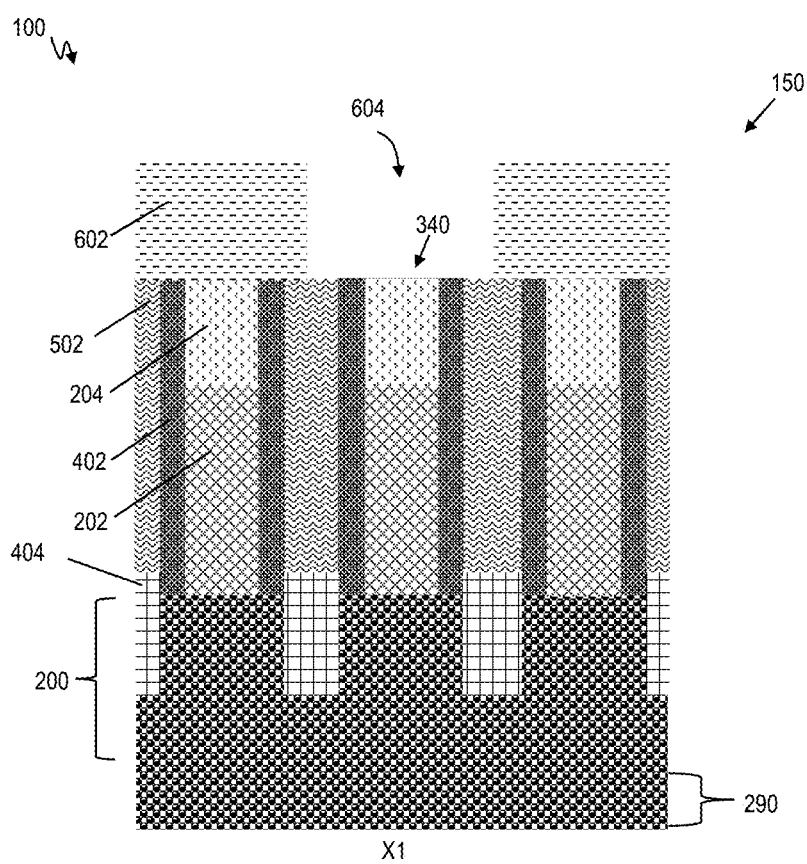

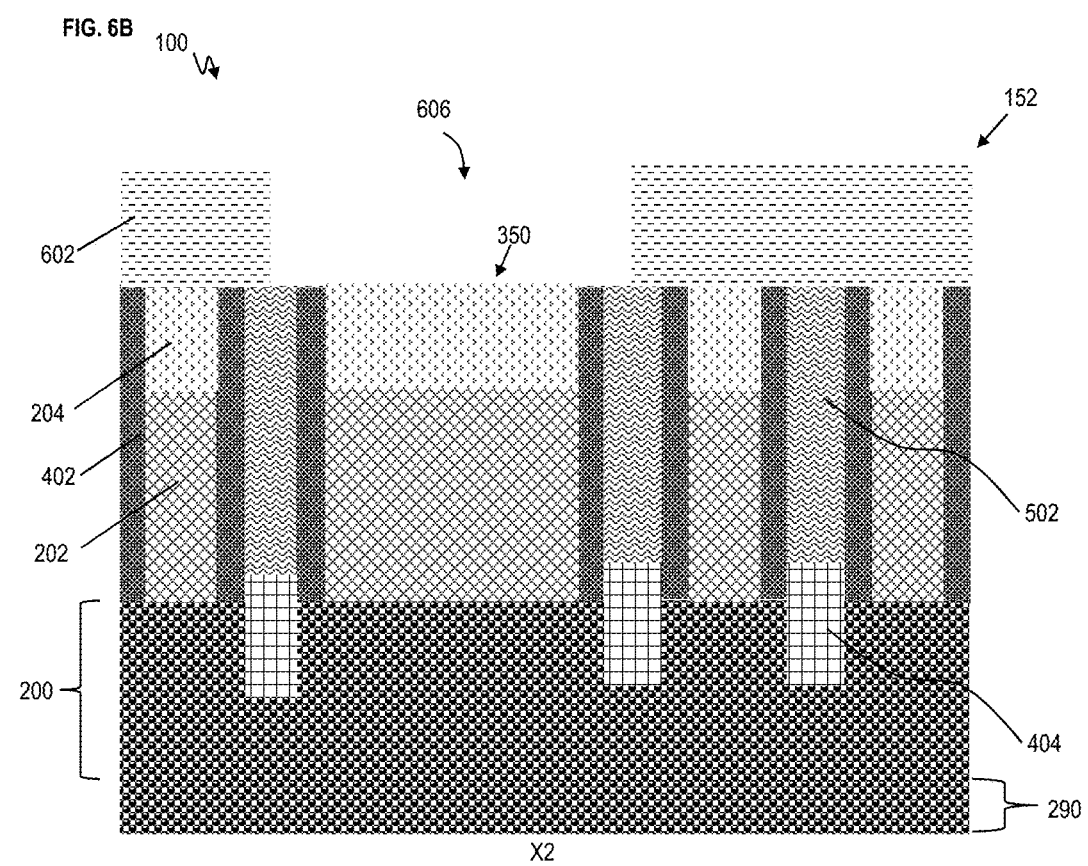

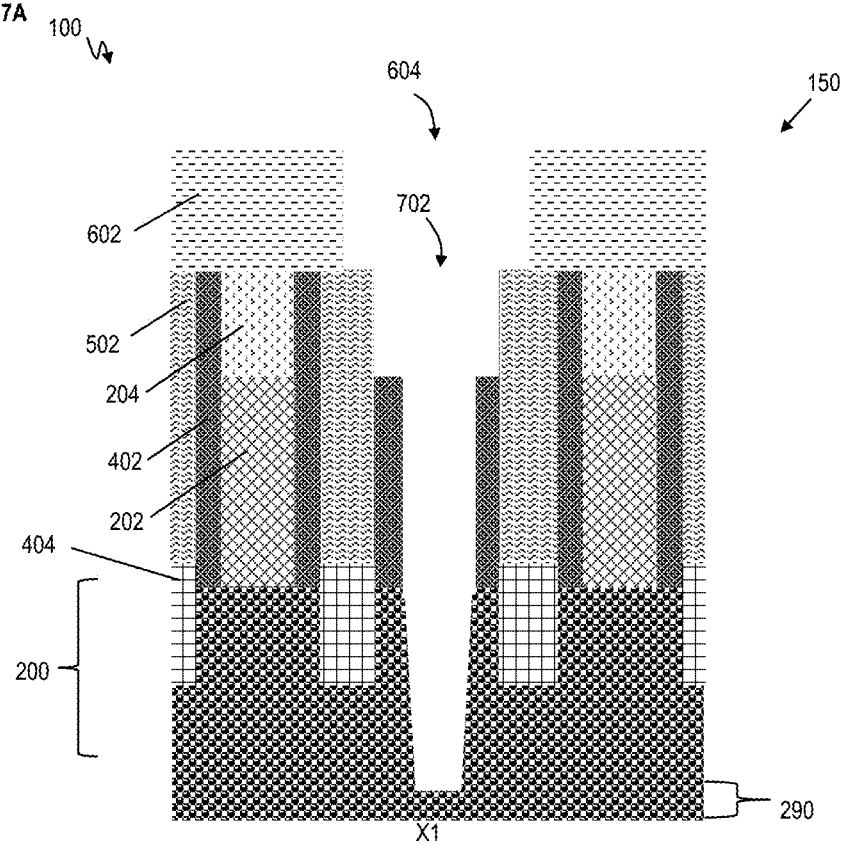

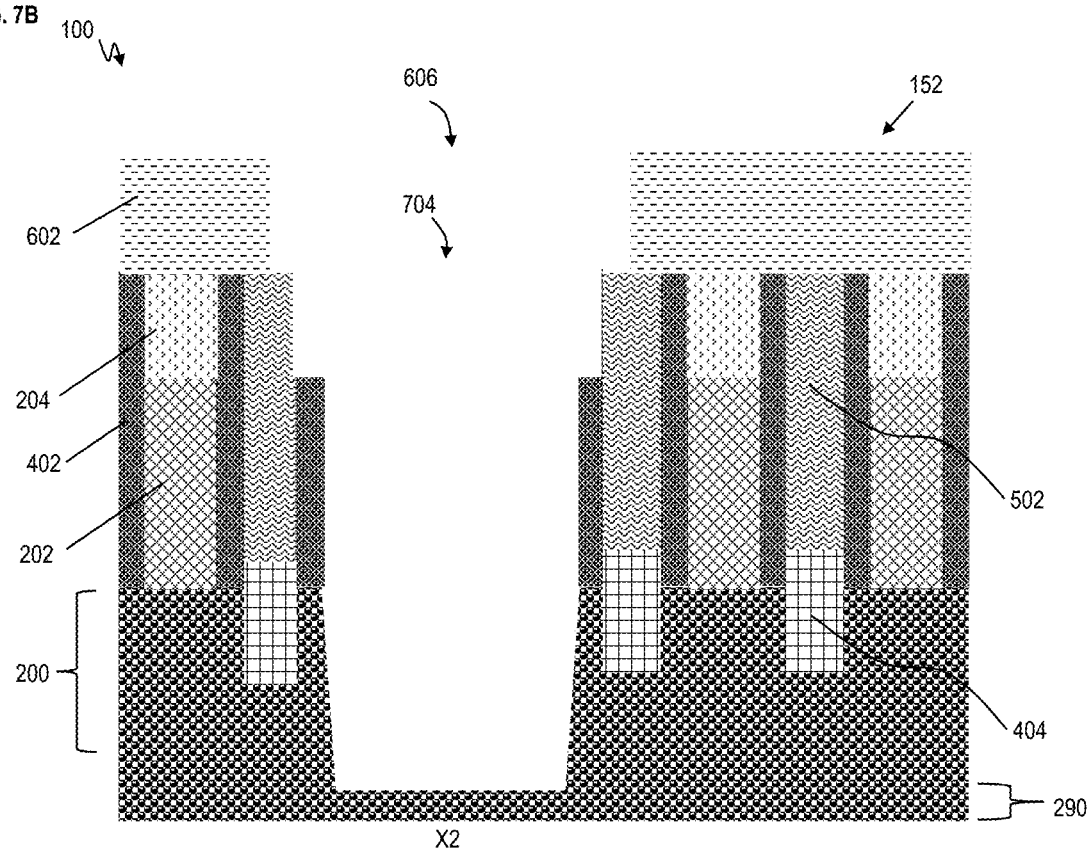

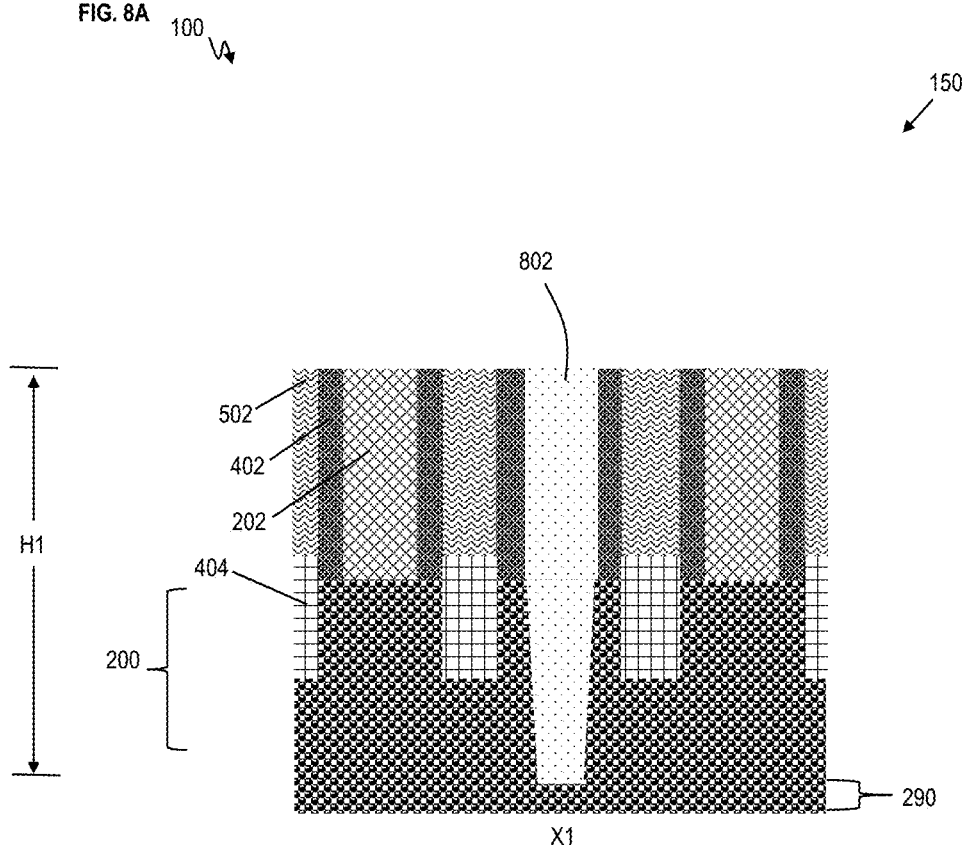

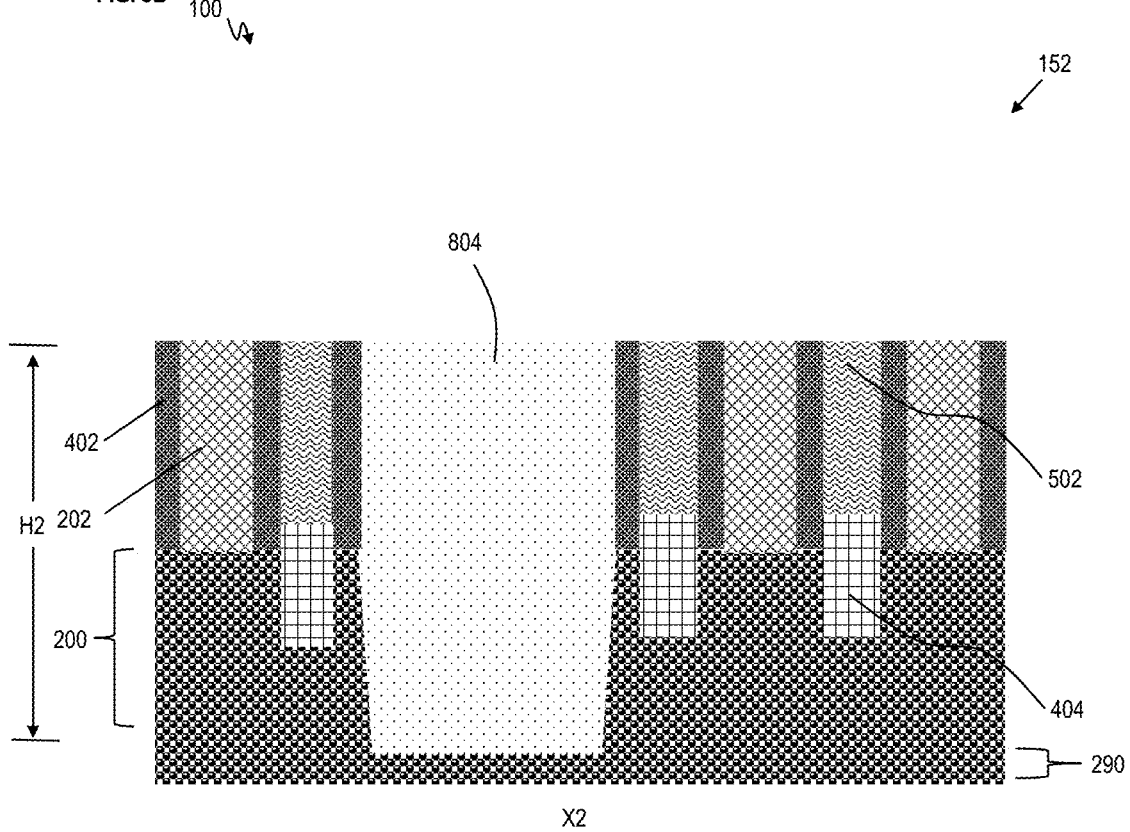

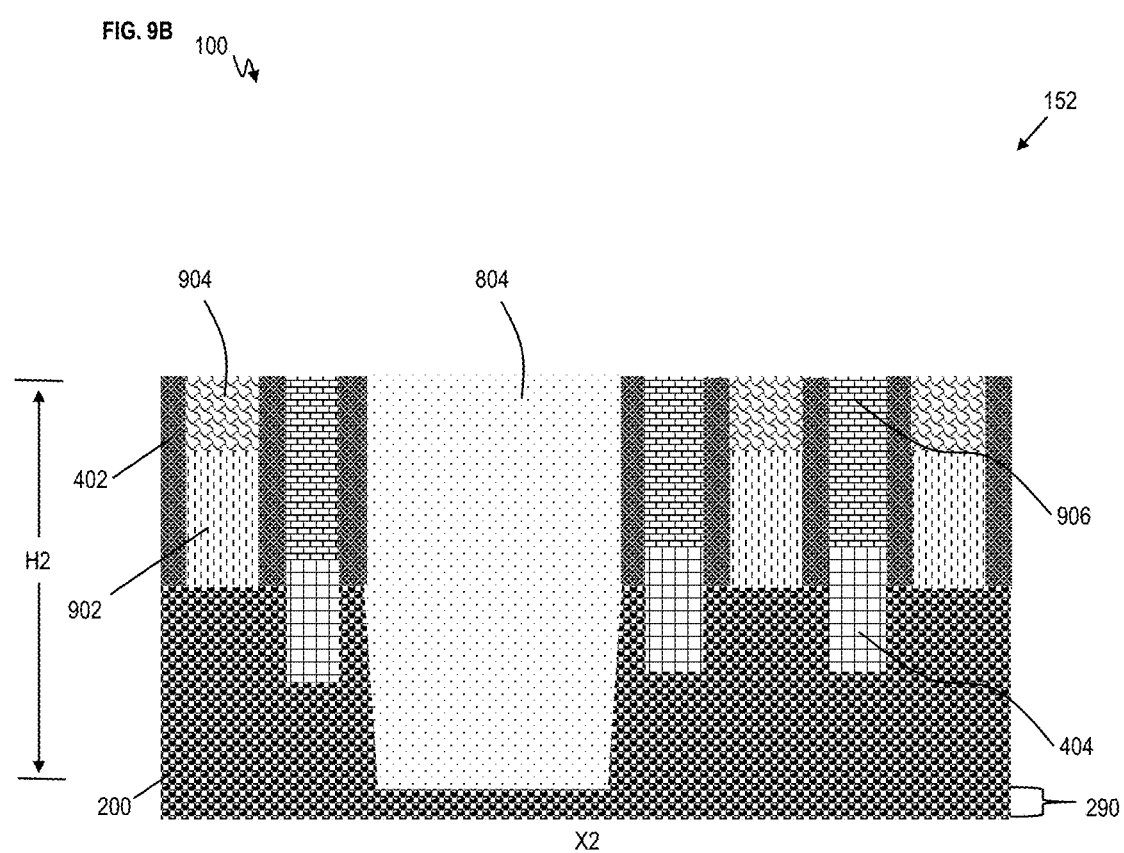

FIN CUT FORMING SINGLE AND DOUBLE DIFFUSION BREAKS

BACKGROUND

The present invention generally relates to fabrication methods and resulting structures for semiconductor devices, and more specifically, to a late fin cut forming both single and double diffusion breaks.

A metal-oxide-semiconductor field-effect transistor (MOSFET) is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on"). A fin type field effect transistor (FET) is a type of nonplanar MOSFET. FinFET devices include an arrangement of fins disposed on a substrate. The fins are formed from a semiconductor material. A gate stack is arranged over the fins and defines a channel region of the fins, while regions of the fins extending outwardly from the channel region define active source and drain regions of the device. Various state-of-the-art techniques can be used for forming the fin.

SUMMARY

Embodiments of the invention are directed to a method for forming a semiconductor device. A non-limiting example of the method includes forming a trench in a space structured to accommodate at least two dummy gates in a cell, the space structured to accommodate the at least two dummy gates aligning to another two gates in another cell, the space further including an area previously occupied by a portion of fins. Also, the method includes forming dielectric material in the space, such that the dielectric material in the space in the cell aligns to the another two gates in the another cell.

Embodiments of the invention are directed to a semiconductor device. A non-limiting example of the semiconductor device includes fins in a cell and a trench filled with dielectric material formed in a space previously structured to accommodate at least two dummy gates in the cell. The dielectric material in the space aligns to another two gates in another cell, the space further including an area previously occupied by a portion of fins.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1 depicts a top view of a simplified diagram of a semiconductor device according to embodiments of the invention;

FIG. 2B depicts a cross-sectional view of the semiconductor device taken along line X2 of FIG. 1 after fabrication operations according to embodiments of the invention;

FIG. 3A depicts a cross-sectional view of the semiconductor device taken along line X1 after fabrication operations according to embodiments of the invention;

FIG. 3B depicts a cross-sectional view of the semiconductor device taken along line X2 after fabrication operations according to embodiments of the invention;

FIG. 4A depicts a cross-sectional view of the semiconductor device taken along line X1 after fabrication operations according to embodiments of the invention;

FIG. 5B depicts a cross-sectional view of the semiconductor device taken along line X2 after fabrication operations according to embodiments of the invention;

FIG. 6A depicts a cross-sectional view of the semiconductor device taken along line X1 after fabrication operations according to embodiments of the invention;

FIG. 6B depicts a cross-sectional view of the semiconductor device taken along line X2 after fabrication operations according to embodiments of the invention;

FIG. 7A depicts a cross-sectional view of the semiconductor device taken along line X1 after fabrication operations according to embodiments of the invention;

FIG. 7B depicts a cross-sectional view of the semiconductor device taken along line X2 after fabrication operations according to embodiments of the invention;

FIG. 8A depicts a cross-sectional view of the semiconductor device taken along line X1 after fabrication operations according to embodiments of the invention;

FIG. 8B depicts a cross-sectional view of the semiconductor device taken along line X2 after fabrication operations according to embodiments of the invention;

FIG. 9B depicts a cross-sectional view of the semiconductor device taken along line X2 after fabrication operations according to embodiments of the invention.

Figure 2A:
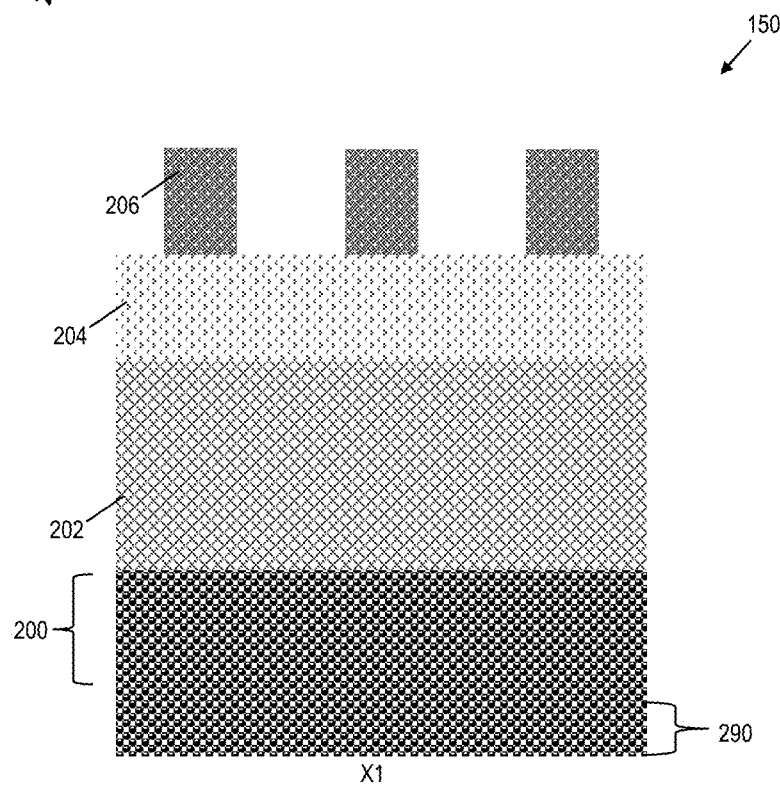
FIG. 2A depicts a cross-sectional view of the semiconductor device taken along line X1 of FIG. 1 after fabrication operations according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, both a single diffusion break and a double diffusion break are utilized for state-of-the-art technology and expected for future technology. Forming mixed single diffusion breaks and double diffusion breaks on the same device can have various issues. Mixed single and double diffusion breaks on a device can increase mask count and cost. The fin cut cannot be combined in a single mask because the state-of-the-art technique forms the double diffusion break in the fin module and single diffusion break in the poly open (POC) module. Accordingly, the fin cut is decomposed into two processing operations. For mixed single and double diffusion breaks on a device having aggressively scaled technology and tall fins such as with a nanosheet fin device, challenges are introduced for the double diffusion break edge. Also, mixed single and double diffusion breaks utilize metal in the double diffusion break which is an additional source of parasitic capacitance.

Turning now to an overview of aspects of the invention, one or more embodiments of the invention provide a late cut process to form a FinFET device using single diffusion break and double diffusion break. Both the single diffusion break and double diffusion break are formed by using a single mask for the fin cut which reduces the process complexity and cost. Additionally, both the single diffusion break and double diffusion break are filled with dielectric material to reduce parasitic capacitance.

Turning now to a more detailed description of aspects of the present invention, FIG. 1 depicts a top view of a simplified diagram of a semiconductor device 100 according to embodiments of the invention. The semiconductor device 100 is a finFET device. In some examples, the techniques described herein can be applied to a nanosheet device instead of the finFET device 100. Some elements are omitted in FIG. 1, and FIG. 1 is intended to provide a general orientation for subsequent figures. FIG. 1 depicts a single diffusion break side 150 in cell A and a double diffusion break side 152 in cell B of the semiconductor device 100. Cells A and B abut at the cell boundary. The double diffusion break (DDB) has a lateral width (in the current transport direction or gate length direction of the finFET devices) of the isolation material between the two active regions, and the lateral width approximately corresponds to the lateral width of two of the gate structures. The single diffusion break (SDB) has a lateral width (in the current transport direction or gate length direction of the finFET devices) of the isolation material between the two active regions is less than the lateral width of a single gate structure. Although the single diffusion break side 150 and double diffusion break side 152 might appear spaced apart or separate, both sides 150 and 152 are formed on the same semiconductor device 100. The semiconductor device 100 includes fins, future gate locations, and future fin cut locations across dummy gates, and active gates, as discussed further below. In some examples, the gates can run across both the single diffusion break side 150 and double diffusion break side 152. In some examples, there can be a few gates that do not extend across both the single diffusion break side 150 and double diffusion break side 152. The lines X1 and X2 represent locations for cross-sectional cuts taken in the single diffusion break side 150 and double diffusion break side 152 respectively, as depicted in subsequent figures. The line X3 represents a cross-sectional cut taken along active/functional gate locations in cell B.

FIG. 2A depicts a cross-sectional view taken along line X1 of the semiconductor device 100 after fabrication operations according to embodiments of the invention. FIG. 2B depicts a cross-sectional view taken along line X2 of the semiconductor device 100 after fabrication operations according to embodiments of the invention. FIG. 2A depicts the single diffusion break side 150 while FIG. 2B depicts the double diffusion break side 152. After initial fabrication processing, the semiconductor device 100 includes fins 200 on a substrate 290. The fins 200 are formed in cell A and cell B. The fins 200 can be formed of the substrate material or formed on the substrate 290 such as a wafer. The fins 200 can be formed using standard lithography processing including sidewall image transfer (SIT), mandrels, etc. Example materials of the fins 200 can include silicon (Si), silicon germanium (SiGe), III-V semiconductors, etc. Also, a portion or portions of the fins 200 can be doped as desired.

Dummy gate material 202 is formed on the fins 200. Prior to dummy gate material deposition, a dummy silicon suboxide layer (now shown) can be deposited first. Example materials of the dummy gate material 202 can include polysilicon, amorphous silicon, etc. A gate hardmask layer 204 is formed on the dummy gate material 202. Example materials of the gate hardmask layer 204 can include nitride-based materials such as silicon nitride (SiN), oxynitrides, etc. A sacrificial layer is deposited on top of the gate hardmask layer 204 and etched into sacrificial blocks 206. Example materials of the sacrificial blocks 206 can include amorphous silicon, amorphous carbon or silicon oxide. FIG. 2B depicts a block mask 208 formed between two of the sacrificial blocks 206. The block mask 208 can tolerate some misalignment. An anti-reflective material 210 can be formed on top of the block mask 208. Example materials of the block mask 208 can include an organic planarization layer (OPL), organic dielectric layer (ODL), etc. The anti-reflective material 210 can be a silicon-based material, including but not limited to silicon oxide, silicon oxynitride. Other example materials of the anti-reflective material 210 can include aluminum nitride, titanium oxide, SiARC, etc. The block mask 208 and anti-reflective material 210 can be patterned into the desired shape by depositing a photoresist material (not shown) on top, exposing the photoresist material, etching the photoresist material along with the block mask layer and anti-reflective material underneath as desired, and removing the photoresist material.

FIG. 3A depicts a cross-sectional view taken along line X1 of the semiconductor device 100 after fabrication operations according to embodiments of the invention. FIG. 3B depicts a cross-sectional view taken along line X2 of the semiconductor device 100 after fabrication operations according to embodiments of the invention. FIG. 3A depicts the single diffusion break side 150 while FIG. 3B depicts the double diffusion break side 152. Etching is performed to etch through the dummy gate material 202 and gate hardmask layer 204 stopping on the fins 200, thereby forming trenches 302 and patterned dummy gates 340 and 350 at a gate pitch. The dummy gates 340 and 350 are formed as a result of patterning the dummy gate material 202. Although 3 dummy gates 340 are illustrated in FIG. 3A, it should be appreciated that the single diffusion break side 150 can have fewer or more dummy gates. Although 3 dummy gates 340 and 1 wide dummy gate 350 are illustrated in FIG. 3B, it should be appreciated that the double diffusion break side 152 can have fewer or more dummy gates.

A directional etch can be utilized to pattern the dummy gates 340 and 350. For example, directional reactive ion etching (RIE) can be utilized. Material under the sacrificial blocks 206 is protected, such that the pattern of the sacrificial blocks 206 is transferred to the dummy gate material 202 and gate hardmask layer 204. FIG. 3B depicts the wide pattern for dummy gate 350 formed in the dummy gate material 202 and gate hardmask layer 204 on the double diffusion break side 152. The wide pattern of dummy gate 350 was protected by the block mask 208 and anti-reflective material 210 along with the sacrificial blocks 206 during the etch, in FIG. 3B. The wide dummy gate 350 can be twice the width of dummy gates 340 not protected by block mask 208 and anti-reflective material 210. The etching of FIGS. 3A and 3B can be performed in the same fabrication process for both the single diffusion break side 150 and double diffusion break side 152. After etching, the sacrificial blocks 206, block mask 208, and anti-reflective material 210 are removed, thus leaving patterned dummy gate material 202 as dummy gates 340 and 350. The dummy gates 340 and 350 can generally be referred to as dummy gates. The wide dummy gate 350 is formed to have a larger lateral dimension than the smaller dummy gates 340.

Figure 4B:
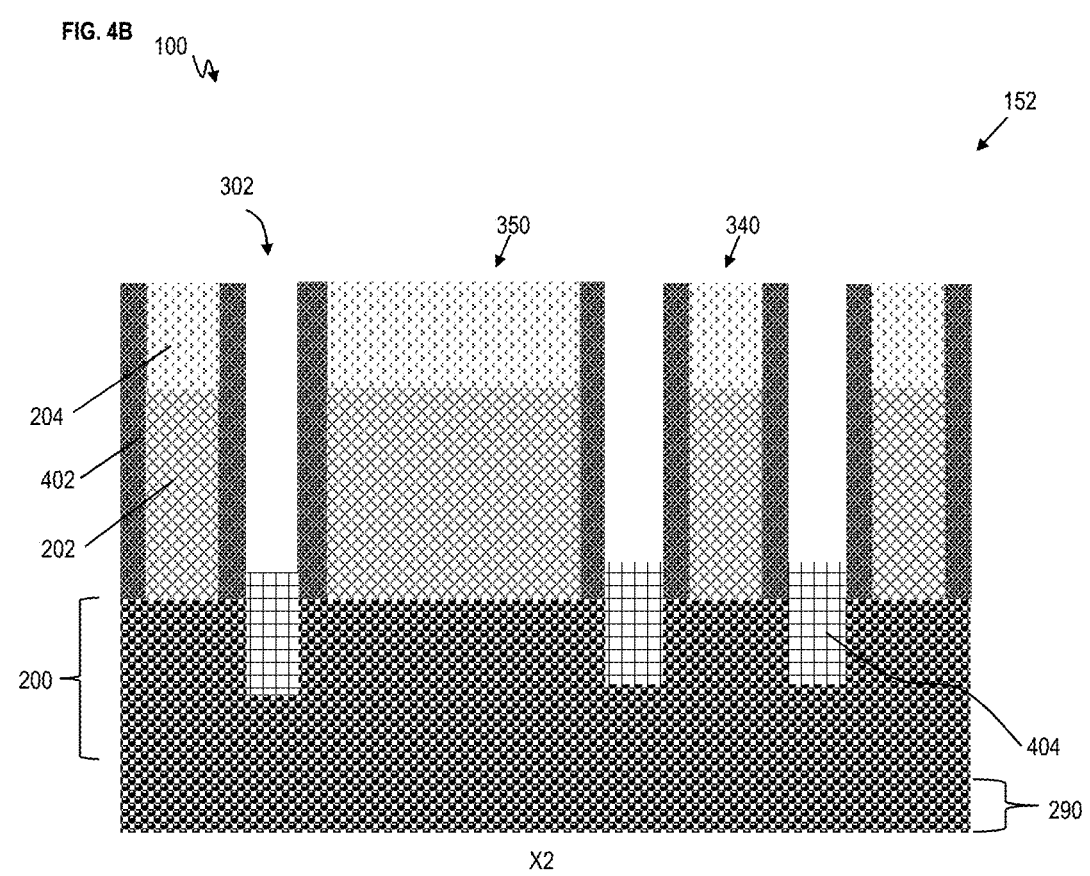
FIG. 4B depicts a cross-sectional view of the semiconductor device taken along line X2 after fabrication operations according to embodiments of the invention.

FIG. 4A depicts a cross-sectional view taken along line X1 of the semiconductor device 100 after fabrication operations according to embodiments of the invention. FIG. 4B depicts a cross-sectional view taken along line X2 of the semiconductor device 100 after fabrication operations according to embodiments of the invention. FIG. 4A depicts the single diffusion break side 150 while FIG. 4B depicts the double diffusion break side 152. Spacer formation is performed to form spacers 402 on the sidewalls of the trenches 302, particularly on the sidewalls of the dummy gates 340 and 350. For example, spacer material is deposited and a directional etch is performed to remove the spacer material from the horizontals surfaces while allowing the spacers 402 to remain on the sidewalls of the dummy gate material 202 and hardmask layer 204 forming trenches 302. The spacer deposition can be a conformal deposition, and the directional etch can be a RIE etch. The spacer material of the spacers 402 can include, for example, nitride-based materials. In some examples, the nitride material can be silicon nitride, silicon oxynitride, silicon oxycarbon nitride, silicon boron carbon nitride and silicon carbon nitride. Epitaxial regions 404 are formed at the bottom of the trenches 302. The epitaxial regions 404 can be doped with n-type dopants or p-type dopants, and the doping can be during deposition or by ion implantation. In some examples, the fins 200 can be etched between the trenches 302 and the epitaxial regions 404 can be epitaxially grown with a concentration of dopants. In some examples, ion implantation can occur and the epitaxial regions 404 can be formed by epitaxial growth above the fins 200. The epitaxial regions 404 are source or drain (S/D) regions for the transistor. The epitaxial source/drain regions 404 can be heavily doped, which has a dopant concentration in the range of about $1\times10^{19}$ cm$^{-3}$ to about $5\times10^{21}$ cm$^{-3}$, about $1\times10^{20}$ cm$^{-3}$ to about $5\times10^{21}$ cm$^{-3}$, or about $1\times10^{20}$ cm$^{-3}$ to about $1\times10^{21}$ cm$^{-3}$. The source/drain regions can be n-doped or p-doped. In various examples, the n-type dopants can include phosphorus (P), arsenic (As) and antimony (Sb), and the p-type dopants include boron (B), gallium (Ga), and indium (In).

Figure 5A:
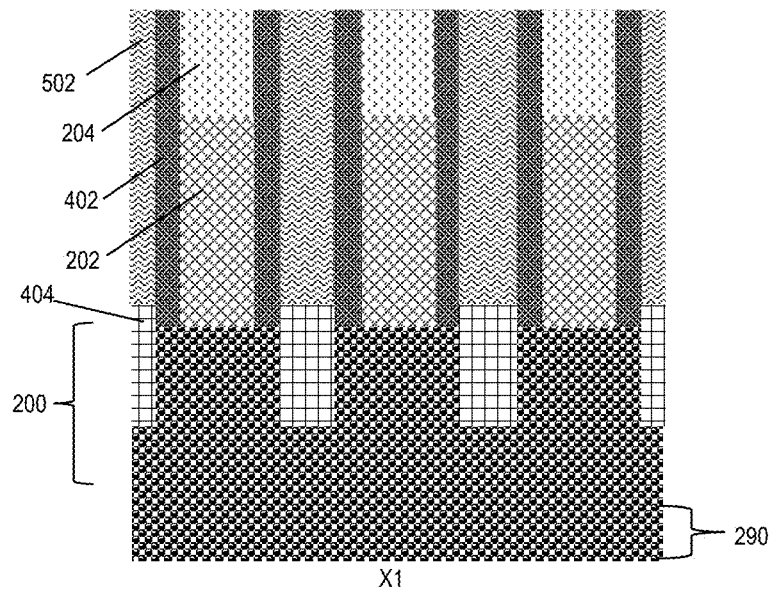
FIG. 5A depicts a cross-sectional view of the semiconductor device taken along line X1 after fabrication operations according to embodiments of the invention.

FIG. 5A depicts a cross-sectional view taken along line X1 of the semiconductor device 100 after fabrication operations according to embodiments of the invention. FIG. 5B depicts a cross-sectional view taken along line X2 of the semiconductor device 100 after fabrication operations according to embodiments of the invention. FIG. 5A depicts the single diffusion break side 150 while FIG. 5B depicts the double diffusion break side 152. An interlevel dielectric or interlayer dielectric (ILD) layer 502 is formed in the trenches 302. For example, the ILD layer 502 can be deposited and chemical mechanical polishing/planarization (CMP) can be performed to remove excess material. The ILD layer 502 can be a low-k dielectric material. Example materials for the ILD layer 502 can include but are not limited to silicon oxide, low temperature oxide, high temperature oxide, flowable oxide, or other dielectric materials.

FIG. 6A depicts a cross-sectional view taken along line X1 of the semiconductor device 100 after fabrication operations according to embodiments of the invention. FIG. 6B depicts a cross-sectional view taken along line X2 of the semiconductor device 100 after fabrication operations according to embodiments of the invention. FIG. 6A depicts the single diffusion break side 150 while FIG. 6B depicts the double diffusion break side 152. Fin cut patterning is performed for fins 200 in both the single diffusion break side 150 and double diffusion break side 152. A single block mask can be used as the fin cut pattern. For example, a block mask 602 is formed on top of the semiconductor device 100. FIG. 6A illustrates the block mask 602 formed with an opening 604 in preparation for the single diffusion break while FIG. 6B illustrates the block mask 602 formed with an opening 606 in preparation for the double diffusion break. As can be seen, the opening 606 for the double diffusion break is wider than the opening 604 for the single diffusion break. The block mask 602 is a material designed to protect the underlying layers from the subsequent etch. Example materials of the block mask 602 can include OPL layers, ODL layers, etc. Analogous to the discussion above for FIGS. 2A and 2B, the block mask 602 is deposited and an anti-reflecting material can be deposited on top. The (single) block mask 602 and anti-reflective material can be patterned into the desired shape with openings 604 and 606 by depositing a photoresist material (not shown) on top, exposing the photoresist material, etching the photoresist material along with the block mask layer and anti-reflective material underneath as desired, and removing the photoresist material. As a result, the (single) block mask 602 has been formed with openings 604 and 606 in preparation for the single diffusion break and double diffusion break, respectively. In some examples, the anti-reflective material might not be utilized to assist with patterning the openings 604 and 606 in the block mask 602.

FIG. 7A depicts a cross-sectional view taken along line X1 of the semiconductor device 100 after fabrication operations according to embodiments of the invention. FIG. 7B depicts a cross-sectional view taken along line X2 of the semiconductor device 100 after fabrication operations according to embodiments of the invention. FIG. 7A depicts the single diffusion break side 150 while FIG. 7B depicts the double diffusion break side 152. Dummy gate cut and fin etch are performed to form trenches 702 and 704, thereby interrupting the gate pitch for the dummy gates 340 and 350 because the trenches 702 and 704 respectively replace dummy gates 340 and 350.

An etch is performed to remove the gate hardmask layer 204 at openings 604 and 606 on both the single diffusion break side 150 and double diffusion break side 152. A dry etch process (e.g., a reactive ion etch (RIE), plasma etching, or the like) can be performed. Particularly, the dummy gate hardmask layer 204 is removed using the dry etch process. As such, the dummy gate material 202 is exposed at openings 604 and 606. The directional etch continues to remove the exposed dummy gate material 202 and recesses a portion of the exposed spacers 402 in the openings 604 and 606. Further, the directional etch continues to etch a portion of the fins 200 exposed by the openings 604 and 606, thereby forming trenches 702 and 704, respectively. In some examples, a wet etch process using phosphoric acid ($H_3PO_4$) can also be used to further etch exposed portions of the fins 200. Trench 702 corresponds to the single diffusion break in FIG. 7A while trench 704 corresponds to the double diffusion break in FIG. 7B. In general, single diffusion break trench 702 and double diffusion break trench 704 are substantially self-aligned to the sidewall spacers 402 adjacent to the ILD layer 502. As can be seen, the depth of trenches 702 and 704 extends downward into the material of fins 200 below the bottom of epitaxial regions 404 and/or extends downward into substrate material of substrate 290. The depth of the single diffusion break trench 702 and double diffusion break trench 704 can vary depending upon the particular applications. For example, the depth of the single diffusion break trench 702 and double diffusion break trench 704 can extend about 30 to 200 nm below the bottom of the fins 200. The tops of trenches 702 and 704 extend upward to stop at about the top of the spacers 402 which have not been recessed, top of the gate hardmask layer 204, and/or top the ILD layer 502.

FIG. 8A depicts a cross-sectional view taken along line X1 of the semiconductor device 100 after fabrication operations according to embodiments of the invention. FIG. 8B depicts a cross-sectional view taken along line X2 of the semiconductor device 100 after fabrication operations according to embodiments of the invention. FIG. 8A depicts the single diffusion break side 150 while FIG. 8B depicts the double diffusion break side 152. After removing the block mask 602, the trenches 702 and 704 can be filled with a dielectric material and CMP is performed to remove excess dielectric material. In some examples, the trenches 702 and 704 can be filled with the dielectric material before removing the block mask 602, and the CMP can planarize the dielectric material and remove the block mask 602. Additionally, whether the block mask 602 is removed before or after filling the trenches 702 and 704 with the dielectric material, the CMP removes the hardmask layer 204 over remaining dummy gate material 202 of dummy gates 340, recesses the ILD layer 502, and recesses the spacers 402.

The dielectric material can be an oxide-based material, such as silicon dioxide, etc. The dielectric material can be a nitride-based material, such as silicon nitride. As depicted in FIG. 8A, filling the trench 702 with the dielectric material forms a diffusion isolation trench 802 with a height H1 on the single diffusion break side 150. As depicted in FIG. 8B, filling the trench 704 with the dielectric material forms a diffusion isolation trench 804 with a height H2 on the double diffusion break side 152. Particularly, it can be seen that these process operations result in the formation of the single diffusion break (SDB) isolation structure 802 and the double diffusion break (DDB) isolation structure 804 each having only dielectric insulating materials. This configuration can be useful in some applications where there is no need or desire to form a conductive material in all or part of the space occupied by insulating material in FIG. 8A and FIG. 8B. Such a configuration of the diffusion isolation trenches 802 and 804 (having only insulating materials) reduces parasitic capacitance.

Figure 9A:
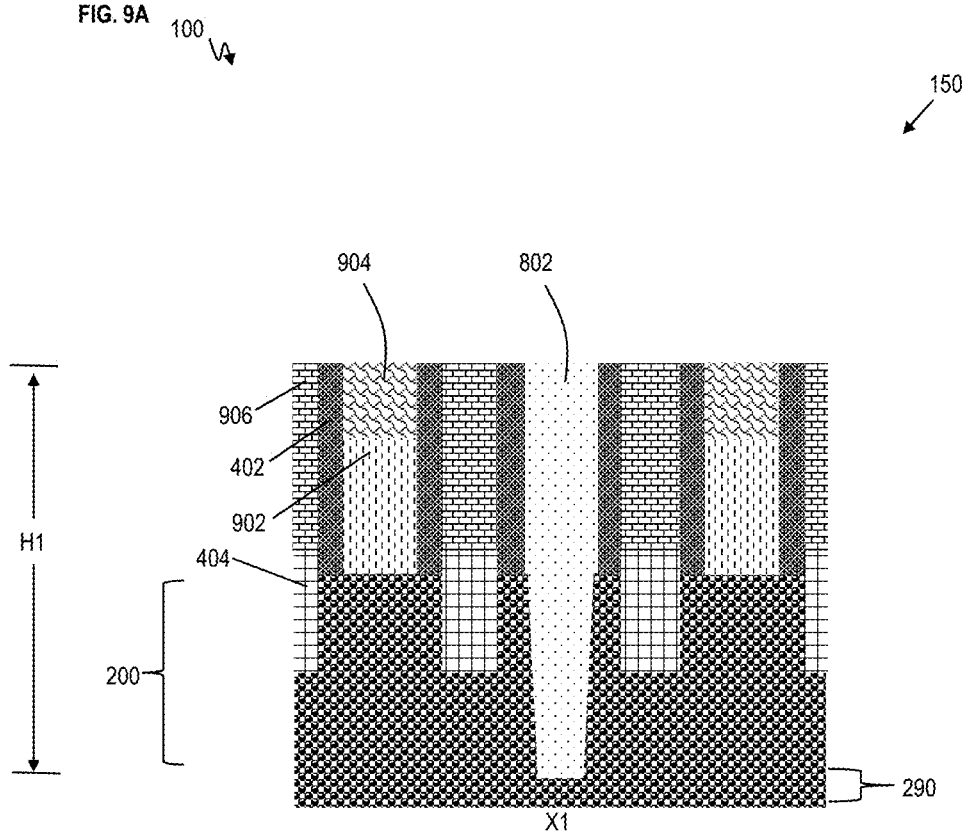
FIG. 9A depicts a cross-sectional view of the semiconductor device taken along line X1 after fabrication operations according to embodiments of the invention.
Figure 9C:
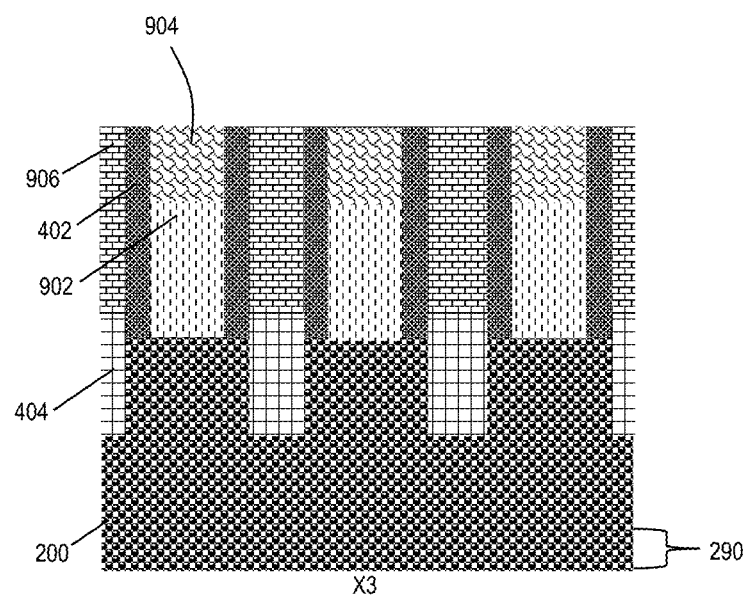
FIG. 9C depicts a cross-sectional view of the semiconductor device taken along line X3 after fabrication operations according to embodiments of the invention.

FIG. 9A depicts a cross-sectional view taken along line X1 of the semiconductor device 100 after fabrication operations according to embodiments of the invention. FIG. 9B depicts a cross-sectional view taken along line X2 of the semiconductor device 100 after fabrication operations according to embodiments of the invention. FIG. 9A depicts the single diffusion break side 150 while FIG. 9B depicts the double diffusion break side 152. FIG. 9C depicts a cross-sectional view of the semiconductor device taken along line X3 after fabrication operations according to embodiments of the invention. A replacement metal gate process is performed.

Etching is performed to remove the dummy gate material 202 leaving a cavity, and a gate material 902 is formed in the cavity. In other words, the remaining dummy gates 340 are replaced with the functional gates used to operate the transistors. Any locations where dummy gates are desired can be covered with a block mask during the replace metal gate process. A gate cap layer is deposited in each of the replacement gate cavities to form gate caps 904, thereby forming the gate caps 904 on top of the gate material 902 which forms the active/functional gates. Typically, the replacement gate structure 902 includes a gate insulation material (not shown) and various layers of conductive material that are sequentially deposited into the cavities and above the layer of insulating material 502. For example, a conformal deposition process can be performed to form a high-k (e.g., k value of 10 or greater) gate insulation layer (not shown) in the replacement gate cavities and one or more conductive metal layers (which serve as the conductive gate structure of the completed devices) are then deposited into the gate cavities. Then, one or more CMP processes are performed to remove excess materials positioned outside of the gate cavities and above the layer of insulating material 502. Next, a recess etching process can be performed to recess the materials in the cavities to make room for the gate cap layers 904. Then, the gate cap layers 904 (e.g., silicon nitride) can be formed in the gate cavities above the recessed gate material 902. In some examples, the gate material 902 can include one or more work functional materials/metals formed on the high-k material. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include a dopant such as lanthanum or aluminum. As noted above, high-k dielectric materials can have a dielectric constant greater than 3.9, 7.0, or 10.0. The one or more work function materials/metals can be p-type FET (PFET) work function materials for PFET devices and n-type FET (NFET) work function materials for NFET devices. Example NFET work function materials can include TiN, TiC, TiAlN, etc. Example PFET work function materials can include TiN and others.

Lithography pattering and etching processes are performed by etching the ILD layer 502 leaving cavities above the epitaxial regions 404, and source/drain contacts 906 are formed in the cavities. Source/drain contacts 906 are formed on the epitaxial regions 404 which are source/drain regions. Trench silicide can be formed at the interface of the source/drain contacts 906 and the epitaxial regions 404, after annealing. The source/drain contacts 906 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments, the contacts can be copper and can include a barrier metal liner. The barrier metal liner prevents the copper from diffusing into, or doping, the surrounding materials, which can degrade their properties.

The height H1 of the diffusion isolation trench 802 and height H2 of the diffusion isolation trench 804 can be same or about the same. In some examples, the height H1 can be greater than the height H2, or vice versa. In some examples, the tops of the heights H1 and H2 respectively for diffusion isolation trench 802 and diffusion isolation trench 804 extend to and/or above the epitaxial regions 404 (or source/drain regions). In some examples, the tops of the heights H1 and H2 respectively for diffusion isolation trench 802 and diffusion isolation trench 804 extend to and/or above the gate material 902 which can be referred to as the functional gates or gates. In some examples, the tops of the heights H1 and H2 respectively for diffusion isolation trench 802 and diffusion isolation trench 804 extend to the gate contacts 904 and/or reach the tops of the gate contacts 904.

As noted above, the filled diffusion isolation trench 804 has a greater width than the diffusion isolation trench 802. Two active gates in cell B of FIG. 9C are aligned to the space of two dummy gate locations that would have been formed in cell A as depicted in FIG. 1. However, the filled diffusion isolation trench 804 is now formed at the fin cut location depicted in cell A of FIG. 1, and this fin cut location encompasses the space of the two dummy gate locations as well as the area between the two dummy gate locations. Further, it should be recognized that the single wide dummy gate 350, which includes the space of the two dummy gate locations, was formed at the fin cut location in cell A as depicted in FIG. 3B instead of forming the two dummy gates in cell A. As such, the single wide dummy gate 350 in FIG. 3B was aligned to the two active gates in cell B. After replacement of the single wide dummy gate 350 with the diffusion isolation trench 804, the diffusion isolation trench 804 in cell A automatically aligns to the two active gates in cell B according to embodiments of the invention.

A method is provided for forming a semiconductor device 100 according to embodiments of the invention. The method includes forming a trench 704 in a space structured to accommodate at least two dummy gates in a cell (e.g., cell A), the space structured to accommodate the at least two dummy gates aligning to another two gates in another cell (e.g., cell B), the space further including an area previously occupied by a portion of fins 200. The method includes forming dielectric material in the space (e.g., diffusion isolation trench 804), such that the dielectric material in the space in the cell (e.g., cell A) depicted in FIG. 9B aligns to the another two gates (e.g., gate structures 902) in the another cell (e.g., cell B) depicted in FIG. 9C.

The dielectric material abuts other portions of the fins 200 without wrapping around the fins 200 in FIG. 9B. The dielectric material fills the space. The dielectric material formed in the space creates a double diffusion break structure 804. The trench includes a width dimension depicted in FIG. 9B greater than a width of any one of the another two gates depicted in FIG. 9C. The trench includes a width dimension corresponding to about a combined width of the another two gates. The another two gates are active gates 902. The another two gates are dummy gates 202. Active gates and dummy gates are formed on the fins 200 with a gate pitch, the gate pitch being interrupted by the trench filled with dielectric material formed in the space. The dielectric material filling the trench continues for a height (e.g., H2) greater than a top of the active gates and the dummy gates.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
   forming a trench in a space structured to accommodate at least two dummy gates in a cell, the space structured to accommodate the at least two dummy gates aligning to another two gates in another cell, the space further comprising an area previously occupied by a portion of fins; and
   forming dielectric material in the space, such that the dielectric material in the space in the cell aligns to the another two gates in the another cell, the another two gates being different from the dielectric material and being different from the at least two dummy gates.

2. The method of claim 1, wherein the dielectric material abuts other portions of the fins without wrapping around the fins.

3. The method of claim 1, wherein the dielectric material fills the space.

4. The method of claim 1, wherein the dielectric material formed in the space creates a double diffusion break structure.

5. The method of claim 1, wherein the trench comprises a width dimension greater than a width of any one of the another two gates.

6. The method of claim 1, wherein the trench comprises a width dimension corresponding to about a combined width of the another two gates.

7. A method of forming a semiconductor device, the method comprising:
   forming a trench in a space structured to accommodate at least two dummy gates in a cell, the space structured to accommodate the at least two dummy gates aligning to another two gates in another cell, the space further comprising an area previously occupied by a portion of fins; and
   forming dielectric material in the space, such that the dielectric material in the space in the cell aligns to the another two gates in the another cell, wherein the another two gates are active gates.

8. The method of claim 1, wherein the another two gates are dummy gates.

9. The method of claim 1, wherein active gates and dummy gates are formed on the fins with a gate pitch, the gate pitch being interrupted by the trench filled with the dielectric material formed in the space.

10. The method of claim 9, wherein the dielectric material filling the trench continues for a height greater than a top of the active gates and the dummy gates.

11. A semiconductor device comprising:
    fins in a cell; and
    a trench filled with dielectric material formed in a space previously structured to accommodate at least two dummy gates in the cell, the dielectric material in the space aligning to another two gates in another cell, the space further comprising an area previously occupied by a portion of fins, wherein the another two gates are active gates.

12. The semiconductor device of claim 11, wherein the dielectric material abuts other portions of the fins without wrapping around the fins.

13. The semiconductor device of claim 11, wherein the dielectric material formed in the space creates a double diffusion break structure.

14. The semiconductor device of claim 11, wherein the trench comprises a width dimension greater than a width of any one of the another two gates.

15. The semiconductor device of claim 11, wherein the trench comprises a width dimension corresponding to about a combined width of the another two gates.

16. The semiconductor device of claim 11, wherein the active gates and dummy gates are formed on the fins with a gate pitch, the gate pitch being interrupted by the trench filled with the dielectric material formed in the space.

17. The semiconductor device of claim 16, wherein the dielectric material filling the trench continues for a height greater than a top of the active gates and the dummy gates.

18. The semiconductor device of claim 16, wherein:
    the active gates are formed on the fins;
    gate caps are formed on the active gates; and
    a height of the trench filled with the dielectric material extends to the gate caps.

* * * * *